United States Patent
Klemm et al.

(10) Patent No.: US 7,808,183 B2
(45) Date of Patent: Oct. 5, 2010

(54) ARRANGEMENT FOR THE REGULATION OF THE ELECTRON BEAM POWER OF AN ELECTRON GUN

(75) Inventors: Günter Klemm, Nidda (DE); Andreas Thiede, Dresden-Schonborn (DE); Hans-Jürgen Schneider, Wachtersbach (DE)

(73) Assignees: Applied Materials GmbH & Co. KG, Alzenau (DE); ALD Vacuum Technologies GmbH, Hanau (DE)

( * ) Notice: Subject to any disclaimer, the term of this patent is extended or adjusted under 35 U.S.C. 154(b) by 417 days.

(21) Appl. No.: 11/373,865

(22) Filed: Mar. 10, 2006

(65) Prior Publication Data

US 2006/0250092 A1 Nov. 9, 2006

(30) Foreign Application Priority Data

May 4, 2005 (DE) .................. 10 2005 020 815

(51) Int. Cl.
*H05B 41/14* (2006.01)
(52) U.S. Cl. ..................... 315/98; 315/94; 315/106
(58) Field of Classification Search ............ 315/64, 315/94, 98, 99, 105, 106, 107, 291, 299
See application file for complete search history.

(56) References Cited

U.S. PATENT DOCUMENTS

| | | | |
|---|---|---|---|
| 3,689,798 A | 9/1972 | Brukovsky et al. | |
| 3,909,662 A | 9/1975 | Thomas et al. | |
| 3,909,663 A | 9/1975 | Thomas et al. | |
| 5,138,232 A | 8/1992 | Schleiff et al. | |
| 6,590,216 B1 | 7/2003 | Doran et al. | |

FOREIGN PATENT DOCUMENTS

| | | |
|---|---|---|
| DE | 70 974 | 1/1970 |
| DE | 1 935 710 | 2/1970 |
| DE | 23 25 808 C2 | 12/1974 |
| DE | 23 39 337 A1 | 4/1984 |
| DE | 40 31 286 | 4/1992 |
| DE | 102 42 538 | 3/2004 |
| JP | 57189445 | 11/1982 |
| JP | 59177845 | 10/1984 |
| JP | 60079654 | 5/1985 |

OTHER PUBLICATIONS

Dietrich, et al. Strahlfuhrung und Leistungsteurerung von Elektronenstrahlkanonen bis 600 kW und deren Einsatz in der industriellen Produktion, Apr. 1987.

*Primary Examiner*—Douglas W Owens
*Assistant Examiner*—Jianzi Chen
(74) *Attorney, Agent, or Firm*—Fulbright & Jaworski L.L.P.

(57) ABSTRACT

An arrangement for the regulation of the electron beam power of an electron gun, which comprises a filament cathode, a block cathode and an anode. Between the filament cathode and the block cathode is applied a first voltage, while between the block cathode and the anode a second voltage is applied. With the aid of a first closed-loop regulated system the filament cathode is regulated to a constant current value, which has a filament temperature sufficient for the maximum beam power of the block cathode. A second closed-loop regulated system, such including a block power regulator, which is acted upon by the difference between instantaneous block power value and nominal block power value, regulates the voltage between the filament cathode and the block cathode.

6 Claims, 2 Drawing Sheets

ARRANGEMENT FOR THE REGULATION OF THE ELECTRON BEAM POWER OF AN ELECTRON GUN

This application claims priority under 35 U.S.C. §119 from German Patent Application No. 10 2005 020 815.0 filed May 4, 2005, incorporated herein by reference in its entirety.

BACKGROUND AND SUMMARY OF THE INVENTION

The invention relates to an arrangement for the regulation of the electron beam power of an electron gun.

Electron guns are primarily utilized for melting, welding, working and evaporation of all types, preferably in vacuo. It is here often required to adapt the power of the electron beam to varying conditions.

A frequently utilized electron gun is the three-electrode electron gun, which comprises a filament, a block cathode and an anode. As a rule, the filament, also referred to as primary cathode, is comprised of a tungsten wire spiral, through which current flows. In the vacuum, due to thermal emission, electrons are emitted from the surface of the wire spiral in sufficient quantities. In front of the filament is located the block cathode, also referred to as secondary cathode, which is intended to emit the high-power electron beam.

To accomplish this, significantly more electrons must be emitted from the block cathode than is the case with the filament. To achieve this emission efficiency of the block cathode, between the filament and the block cathode an electric voltage, the so-called block voltage, is applied. It is of the order of magnitude of up to 3 kV.

This block voltage generates an electron beam between filament and block cathode, which causes intense heating of the block cathode. This manifests itself optically in a bright luminous effect. The electrons discharged in this manner from the block cathode can absorb kinetic energy in an electric field applied between block cathode and anode.

The electric field is generated as a rule by a voltage of the order of magnitude of 40 kV. The block cathode should herein emit as many electrons as are required for providing the desired beam power.

If the emission of electrons is to be kept constant, the temperature of the block or secondary cathode must also be kept constant. A method is already known (DD 70 674) for keeping the emission temperature of the secondary cathode constant in electron guns heated by electron bombardment for electron beam welding, melting and evaporation devices. In this connection, the emission current of the primary cathode is regulated via the heating current of the primary cathode at constant acceleration voltage between the primary cathode and secondary cathode by means of a controlled regulating variable, derived from the heating current, in which the heating current of the primary cathode is limited via a controlled regulating variable derived therefrom The emission current of the block or secondary cathode, also referred to as main cathode, is herein neither acquired nor regulated.

In a known circuit for the regulation of the operating parameters of an electron beam generator a regulating means for the filament cathode is provided, which is comprised of three individual regulators connected in cascade (DE 23 25 808 C2). These individual regulators are a heating current regulator, an emission current regulator and a beam current regulator.

High-power electron and beam guns are often operated at constant voltage over relatively long time periods and at constant emission current. Due to the high thermal inertia of the block cathodes, rapid variation of the power is not possible through the temperature change of the block cathode. Fast changes of the electron beam power could be effected through a negative bias voltage of a Wehnelt [modulator] cylinder. However, since the emission area of the block cathode is very large, the Wehnelt voltage would need to be very high in order to attain therewith a power control (W. Dietrich, H. Ranke and H. Stumpp: *Strahlführung und Leistungsteuerung von Elektronenstrahlkanonen bis 600 kW und deren Einsatz in der industriellen Produktion, Optik* 7-2001, p. 11).

A fast power change could also be attained through the variation of the acceleration voltage, if the cathode is operated in the space charge region. Of disadvantage in this method would be the simultaneously required adaption of the focusing to the changed acceleration voltage in order to obtain an electron beam position independent thereof (W. Dietrich et al., loc. cit.).

Furthermore a device for electron guns is known which comprises a regulator with which the heating current and/or the emission current of the filament can be regulated (DE 40 31 286 A1). The regulator has here a filament heating current regulator and an emission current regulator, and to the filament heating current regulator is supplied the difference between the nominal value of the filament heating current and the instantaneous value of the filament heating current, while to the emission current regulator is supplied the difference between the nominal value of the emission current and the instantaneous value of the emission current. The advantage of this device lies therein that the filament heating system can be optionally regulated via the heating current or the emission current.

In addition, a method for the regulation of the electron beam power of electron sources is also known, with which the regulation of the nominal power from zero to 200 kW is possible (DE 102 42 538 A1). The electron source herein comprises an indirectly heated cathode, an anode as well a focusing electrode. At least two independent correcting elements are provided, each of which varies one of the parameters 'cathode temperature, cathode voltage, focusing electrode voltage and cathode-anode distance' as control parameters.

Lastly, a device for the automatic regulation of the operating state of an electrothermal installation with an electron gun is known, whose main cathode is heated by an electron bunch emitted by an auxiliary cathode (DE 19 35 710). The main cathode of the electron gun is here supplied from a first structural unit and the auxiliary cathode from a second structural unit. In addition, a circuit section for the correction of the main cathode heating is provided, which is connected with at least one of said structural units. With this known device the stability of the operating state of an electron beam installation can be improved. However, a rapid change of the beam power is not associated therewith.

The aim of the invention is to change rapidly the beam power of an electron gun.

This aim is attained with the arrangement according to the present invention.

The invention consequently relates to an arrangement for the regulation of the electron beam power of an electron gun, which comprises a filament cathode, a block cathode and an anode. Between the filament cathode and the block cathode is applied a first voltage, while between the block cathode and the anode a second voltage is applied. With the aid of a first closed-loop regulated system the filament cathode is regulated to a constant current value, which has a filament temperature, which is sufficient for the maximum beam power of the block cathode. A second closed-loop regulated system which includes a block power regulator, which is acted upon by the difference between the instantaneous value of the block power and nominal value of the block power, regulates the voltage between the filament cathode and the block cathode.

The advantage attained with the invention lies in particular therein that it is not necessary to provide three regulators connected in cascade. The regulation becomes thereby faster and disturbances can be better managed. In addition, the closed-loop gain is decreased whereby small disturbances in the block power have less serious effects on the output. The block power, further, is regulated, which represents the temperature better than the block current.

An embodiment example of the invention is shown in the drawing and will be described in further detail in the following.

DETAILED DESCRIPTION

Figure 1:
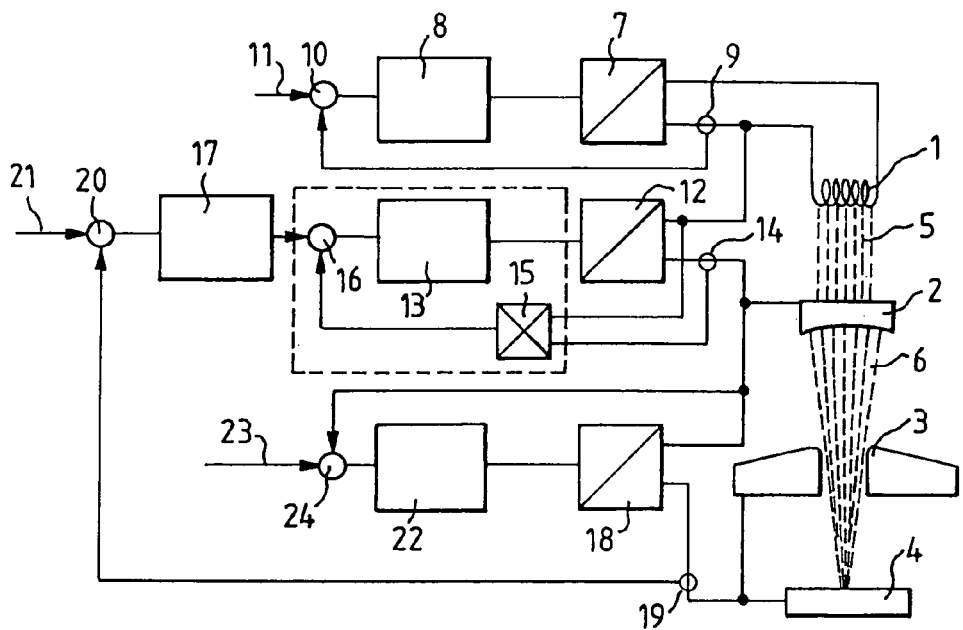
FIG. 1 shows a regulation arrangement according to the invention.

On the right side of FIG. 1 is shown schematically an electron gun. Evident are here a filament or a wire cathode 1, a block cathode 2, an anode 3 as well as a crucible 4. The electrons reaching the block cathode 2 from the filament cathode 1 are provided with the reference number 5, while those electrons reaching the crucible 4 from the block cathode 2 are provided with the reference number G. The filament cathode 1 is connected to a regulatable current source 7. If the current of this current source 7 is increased, the current flow through the filament cathode 1 also increases, whereby the latter is heated more strongly and emits more electrons. The regulation of the current source 7 takes place through a regulator 8. The regulator 8 regulates the current of the wire cathode 1 to a constant value. In this way, at identical ambient conditions a nearly constant temperature of the wire cathode 1 can be achieved.

A current acquisition means 9 measures the current flowing through the filament cathode 1 and supplies the instantaneous current value acquired in this manner to a comparison point 10, where a nominal wire cathode current value 11 is compared with the instantaneous wire cathode current value. The difference of instantaneous current value and nominal current value is conducted to the regulator 8.

The current flowing through the filament cathode 1 is regulated such that the filament cathode 1 emits as many electrons 5 as are necessary for the block cathode 2 to emit its maximally possible electron current 6. Thereby that the current is regulated to a fixed value through the filament cathode 1, the emission current 6 of the block cathode 2 is independent of the time behavior of the filament cathode 1.

The voltage between the filament cathode 1 and the block cathode 2 is provided by a voltage source 12, which is driven by a block power regulator 13. With a current acquisition means 14 the current is measured which is supplied by the voltage source 12. This involves the emission current of the filament cathode 1. This current is multiplied in a multiplier 15 by the voltage of the voltage source 12, such that the electric power is calculated. This power is supplied to the comparison point 16, which receives a signal from an emission current regulator 17. This signal involves a nominal block power signal for the block cathode 2. The output of regulator 17 outputs a signal formed from the difference of the nominal emission current value for the block cathode 2 and the instantaneous emission current value for this block cathode 2. At constant acceleration voltage this signal has a (defined) relationship to the block power, see curve II in FIG. 2. It can therefore serve as the nominal value for the block power regulator 13. The regulator 17 is necessary in order to regulate the emission current of the block cathode 2. This emission current is adapted to the regulation behavior of the emission reach of block cathode 2. The temperature of the block cathode 2 determines at constant acceleration voltage the emission current.

For supplying the acceleration voltage for the electrons 6 emitted by the block cathode 2 a voltage source 18 is provided. The anode 3 and the crucible 4 are herein at the same electric potential. The current supplied by this voltage source 18 is measured by the current acquisition means 19 and conducted to a comparator 20, which is acted upon by a nominal emission current value or nominal beam current value 21. The difference between instantaneous current value and nominal current value is supplied to the regulator 17.

The voltage source 18 is regulated by a regulator 22, upon which acts a signal corresponding to the difference between an instantaneous acceleration voltage value and a nominal acceleration voltage value 23. This difference is determined by a comparator 24. The regulator 22 regulates the acceleration voltage to a constant value. The terminal on the block cathode 2 conducts the instantaneous value of the voltage between block cathode 2 and anode 3, thus the acceleration voltage, to the comparison point at the input of the regulator 22.

For the electron emission of the block cathode 2 consequently the emission current regulator 17 is succeeded by a block power regulator 13. Its output controls the voltage source 12 for the acceleration or block voltage between filament cathode 1 and block cathode 2. From block current and block voltage the instantaneous value of the block power is formed and supplied to the block power regulator 13. The block power is herein directly related to the temperature of the block cathode 2, which, under the effect of a constant acceleration voltage, effects the emission. The block power regulator 13 regulates the power of the block cathode 2 in a manner corresponding to the regulator 17 regulating the emission current. However, regulator 13 must respond significantly faster than regulator 17. It therefore has a shorter reset time and a different gain than regulator 17.

In this arrangement thus only two regulators 17, 13 are connected in series. The regulation operates thereby more stably, and greater gains for higher precision can be set. The nominal values at sites 11, 21 and 23 are entered by an operator via a user interface of the electron beam installation according to the required process conditions.

Figure 2:
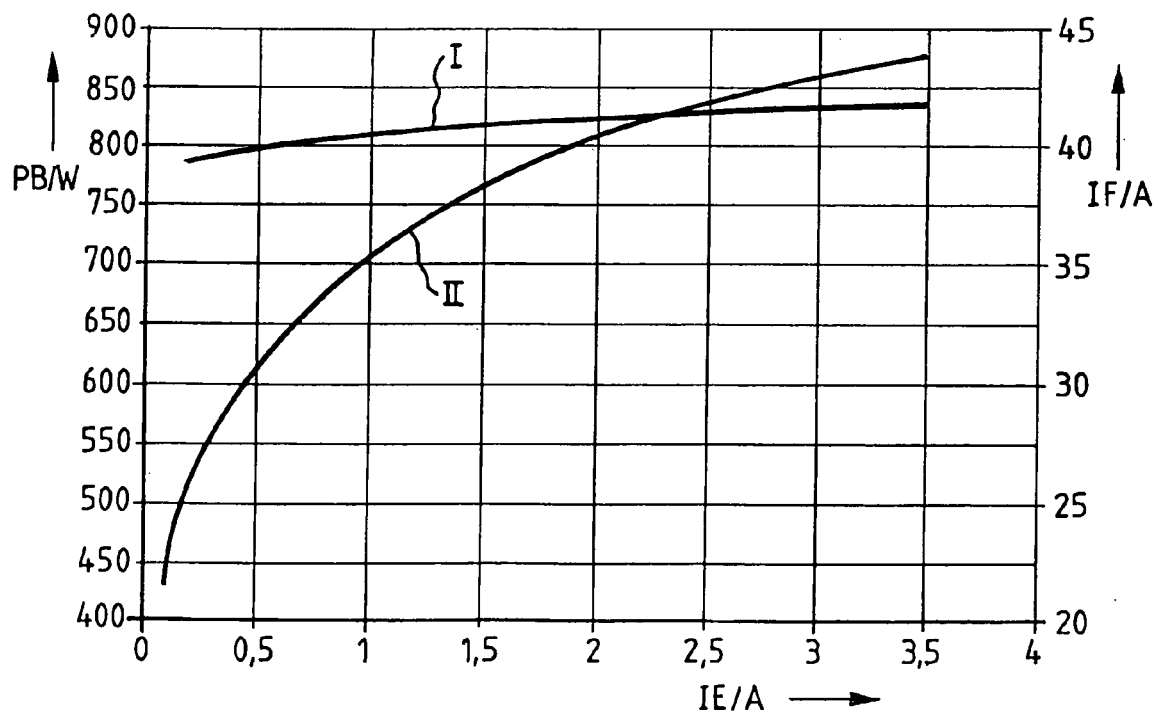
FIG. 2 is a graphical representation of the block power over the emission current for the block power regulation according to the invention compared to the heating current of a wire spiral over the emission current at conventional regulation according to DE 23 25 808 C2.

In FIG. 2 the regulation characteristic II according to the invention is compared with a conventional regulation characteristic I. The conventional regulation characteristic I shows the dependence of the emission current IE of block cathode 2 on the heating current IF of the filament cathode 1. In contrast, the regulation characteristic II shows the dependence of the power PB of block cathode 2 on the emission current IE of the filament cathode 1.

In the conventional regulation characteristic I a minimal change of the heating current IF of the filament cathode 1 leads to a large change of the emission current IE of block cathode 2. If, for example, the heating current IF is increased from 40 A to 41 A, the emission current IE increases from 0.5 A to 1.5 A. The regulation range is very narrow and starts only at approximately 39 A of the heating current of the filament cathode 1.

In the regulation characteristic II according to the invention, in contrast, a greater range of the block power PB is utilized in order to achieve the same change of the emission current IE. This leads to a more stable regulation behavior and higher regulation precision.

Figure 3:
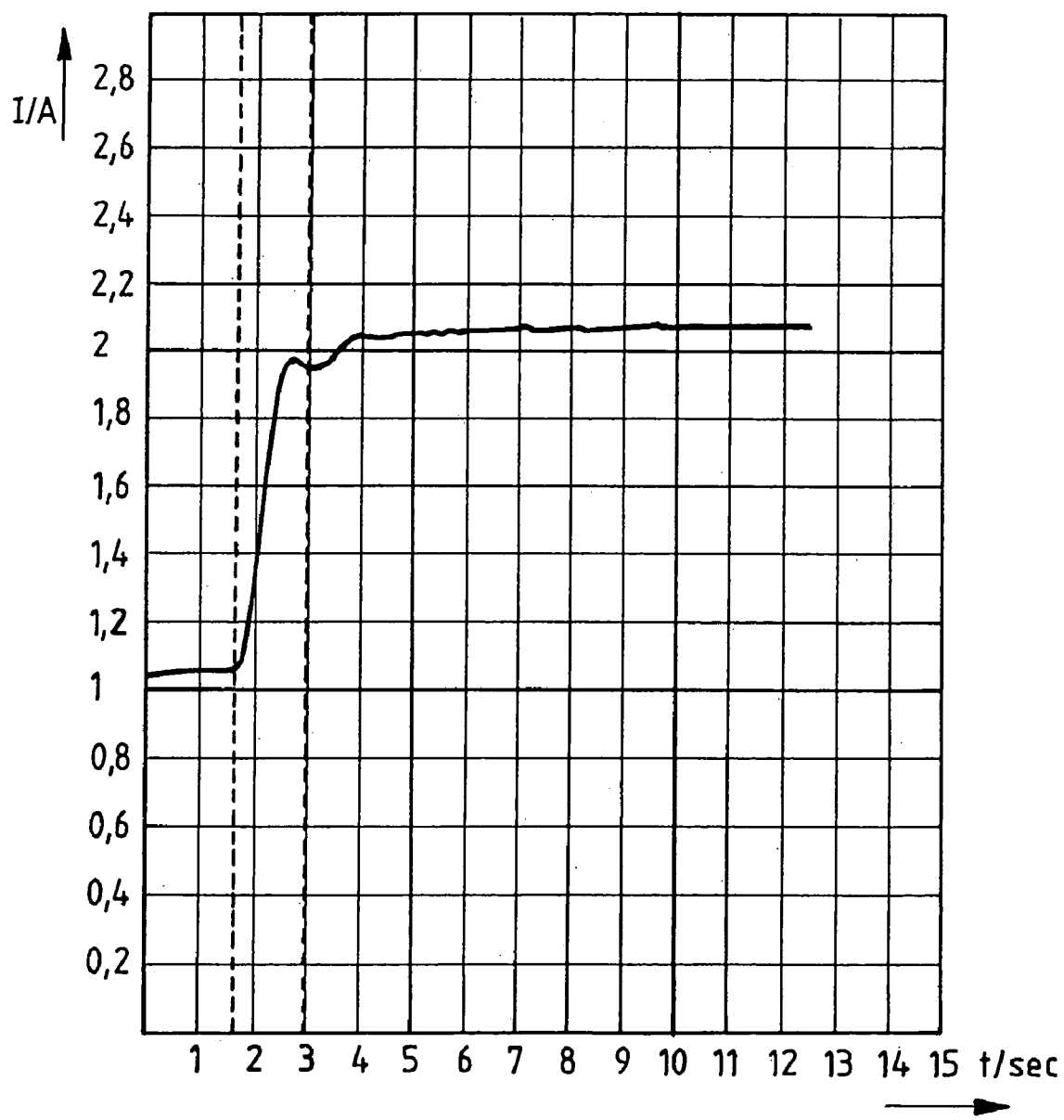
FIG. 3 shows an emission current jump over time.

FIG. 3 shows that the emission current of block cathode 2 at a nominal value jump can jump from one ampere to two amperes within less than one second. At a heating current of the filament cathode 1 kept constant, the block voltage can decrease caused, for example, by an increase of the ambient temperature at increasing block power. Through the lower block voltages, block arcs are avoided, especially at higher powers.

It is claimed:

1. An arrangement for the regulation of the electron beam power of an electron gun, wherein the electron gun comprises a filament cathode, a block cathode and an anode, and between the filament cathode and the block cathode a first voltage is applied, and between the block cathode and the anode a second voltage is applied, wherein a first and a second closed-loop regulated system are provided, wherein
    a) the first closed-loop regulated system regulates the filament cathode to a constant current value, which causes a filament temperature sufficient for a maximum beam power of the block cathode, and wherein
    b) the second closed-loop regulated system includes a block power regulator which is acted upon by the difference between instantaneous block power value and nominal block power value and which regulates the voltage between filament cathode and the block cathode.

2. The arrangement as claimed in claim 1, wherein the first closed-loop regulated system includes a regulator, which is acted upon by the difference of nominal filament current value and instantaneous filament current value and which drives a controllable current source.

3. The arrangement as claimed in claim 1, wherein the first voltage between filament cathode and block cathode is provided by a voltage source, which is regulated by the block power regulator.

4. The arrangement as claimed in claim 1, wherein the second voltage between block cathode and anode is supplied by a regulatable voltage source, which is acted upon by a regulator to whose input the difference of nominal acceleration voltage value and instantaneous acceleration voltage value is supplied.

5. The arrangement as claimed in claim 1, wherein the instantaneous block power value is provided by a multiplier, which multiplies the instantaneous voltage between filament cathode and block cathode by the instantaneous emission current of the filament cathode.

6. The arrangement as claimed in claim 1, wherein the nominal block power value is provided by a regulator, which is acted upon by the difference between the nominal value of the emission current of the block cathode and the instantaneous value of the emission current of the block cathode.

* * * * *